US007553760B2

(12) United States Patent
Yang et al.

(10) Patent No.: US 7,553,760 B2
(45) Date of Patent: Jun. 30, 2009

(54) SUB-LITHOGRAPHIC NANO INTERCONNECT STRUCTURES, AND METHOD FOR FORMING SAME

(75) Inventors: Haining Yang, Wappingers Falls, NY (US); Wai-Kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 436 days.

(21) Appl. No.: 11/550,966

(22) Filed: Oct. 19, 2006

(65) Prior Publication Data
US 2008/0093743 A1    Apr. 24, 2008

(51) Int. Cl.
*H01L 21/302*    (2006.01)

(52) U.S. Cl. .................. 438/637; 438/702; 438/736; 257/E21.575

(58) Field of Classification Search ......... 438/637–640, 438/700, 702, 735–738; 257/E21.575; 977/887–888
See application file for complete search history.

(56) References Cited

U.S. PATENT DOCUMENTS

2004/0127001 A1 *    7/2004    Colburn et al. .............. 438/586

OTHER PUBLICATIONS

Nealey et al., "Self-Assembling Resists for Nanolithography," IEEE, 2005.
Guarini et al., "Nanoscale patterning Using Self-Assembled Polymers for Semiconductor Applications," J. Vac. Sci. Technol., Nov./Dec. 2001, pp. 2784-2788, B 19(6).

* cited by examiner

*Primary Examiner*—Thanhha Pham
(74) *Attorney, Agent, or Firm*—Scully, Scott, Murphy & Presser, P.C.; H. Daniel Schnurmann

(57) ABSTRACT

A method to form interconnect structures including nanoscale, e.g., sub-lithographic, lines and vias for future generation of semiconductor technology using self-assembly block copolymers that can be placed at a specific location using a pre-fabricated hard mask pattern is provided. The inventive method provides an interconnect structure in which the line is self-aligned to the via.

1 Claim, 18 Drawing Sheets

SUB-LITHOGRAPHIC NANO INTERCONNECT STRUCTURES, AND METHOD FOR FORMING SAME

FIELD OF THE INVENTION

The present invention relates to a semiconductor structure and a method of fabricating the same. More particularly, the present invention relates to an interconnect structure including nano-scale conductively filled openings and a method of fabricating the same.

BACKGROUND OF THE INVENTION

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilayered schemes. These interconnect structures typically include copper, Cu, since Cu based interconnects provide higher speed signal transmission between large numbers of transistors on a complex semiconductor chip as compared to aluminum-based interconnects.

Within a typical interconnect structure, metal vias run perpendicular to the semiconductor substrate and metal lines run parallel to the semiconductor substrate. Further enhancement of the signal speed and reduction of signals in adjacent metal lines are achieved in today's integrated circuit product chips by embedding the metal lines and vias in a dielectric material having a dielectric constant of less than silicon dioxide.

In the prior art, interconnect structures are typically fabricated utilizing lithography and etching to define the dimensions of the lines and vias. Photoresists and hard masks are typically used as a means to transfer a desired line and/or via pattern into an underlying dielectric material. As such, the dimensions of the line and/or via openings are limited to the resolution of the lithographic tool. Typically, the currently available 0.93 numerical aperture (NA) lithographic tool can only resolve lithographic patterns with openings of not less than 100 nm in diameter. Future generation of 1.2 NA lithographic tools are expected to print lithographic patterns with openings of about 70 to about 80 nm. Such large opening diameters contribute to undesirable low device density of the integrated circuit.

Moreover, as semiconductor device technology scales, interconnect wiring needs to scale accordingly. The current 45 nm node technology requires the M1-M4 (i.e., the first-fourth metal interconnect) lines to be 64 nm, and upcoming 32 nm node technology requires the same metal lines to be 45 nm, which is beyond the conventional lithographic capabilities as mentioned above.

Therefore, there is a need for reducing the diameters of the openings of the interconnect wiring structures to below the resolutions of the lithographic tools, i.e., there is a need for sub-lithographic feature patterning of interconnect structures for the 64 nm and 32 nm node generations.

SUMMARY OF THE INVENTION

The present invention provides a method to form interconnect structures including nano-scale, e.g., sub-lithographic, lines and vias for future generation of semiconductor technology using self-assembly block copolymers that can be placed at a specific location using a pre-fabricated hard mask pattern. The inventive method provides an interconnect structure in which the line is self-aligned to the via. It is noted that the terms "nano-scale" and "sub-lithographic" are used interchangeably throughout the instant application to denote patterns or openings whose widths are below 60 nm.

In general terms, the present invention provides a method for forming an interconnect structure which comprises:

providing a structure including a patterned hard mask having a lithographically defined opening located above a dielectric material;

forming at least one self-assembling block copolymer having a first polymeric component and a second polymeric component embedded within said at least one lithographically defined opening;

selectively removing one of said first or second polymeric components relative to the other component to form sub-lithographic openings in said at least one self-assembling block copolymer;

transferring said sub-lithographic openings into said dielectric material; and filling said sub-lithographic openings with a conductive material.

In one aspect of the present invention, sub-lithographic lines and vias are formed by utilizing self-assembly block copolymers that have different wetting conditions. In such an aspect, the self-aligned block copolymers form an ordered array of cylinders that, depending on the surface wetting conditions, may be aligned vertical with a surface of the dielectric material or aligned parallel to the surface of the dielectric material. The vertical alignment of the ordered array of cylinders is used in forming sub-lithographic vias, while the parallel alignment of the ordered array of cylinders is used in forming sub-lithographic lines.

More specifically, the method of the present invention comprises:

providing a structure including a patterned hard mask located above a dielectric material, wherein said patterned hard mask includes at least one lithographically defined opening;

providing a first block copolymer having a first single unit polymer block with a sub-lithographic width inside the at least one lithographically defined opening, wherein the first single unit polymer block comprises a second polymeric block component which is embedded in a polymeric matrix that comprises a first polymeric block component of said first block copolymer;

selectively removing the second polymeric block component relative to the first polymeric block component to form a first sub-lithographic opening in the polymeric matrix inside the at least one lithographically defined opening;

patterning the dielectric material using the first sub-lithographic opening;

providing a second block copolymer having a second single unit polymer block with a sub-lithographic width inside the at least one lithographically defined opening, wherein the second single unit polymer block comprises a second polymeric block component which is embedded in a polymeric matrix that comprises a first polymeric block component of said second block copolymer;

selectively removing the second polymeric block component of said second block copolymer relative to the first polymeric block of said second block copolymer to form a second sub-lithographic opening in the polymeric matrix inside the at least one lithographically defined opening;

transferring said second sub-lithographic opening to said dielectric material; and filling the first and second sub-lithographic openings with a conductive material.

In one highly preferred embodiment of the present invention, the first sub-lithographic opening is a sub-lithographic via opening having a width from about 10 to about 40 nm, while the second sub-lithographic opening is a sub-lithographic line opening having a width from about 10 to about 40 nm. In yet another embodiment, which is less preferred relative to the one mentioned above, the first sub-lithographic opening is a sub-lithographic line opening having a width from about 10 to about 40 nm, while the second sub-lithographic opening is a sub-lithographic via opening having a width from about 10 to about 40 nm.

The block copolymers as mentioned hereinabove preferably comprise A:B block copolymers wherein A is a first polymeric component and B is a second polymeric component having a weight ratio of A:B from about 20:80 to about 80:20, and the single unit polymer block preferably comprises a cylinder that stands vertical or parallel to an upper surface of the dielectric material. The block copolymers can be readily selected from the group consisting of polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). In a particularly preferred, but not necessary, embodiment of the present invention, the block copolymers comprise PS-b-PMMA having a PS:PMMA weight ratio ranging from about 20:80 to about 80:20.

In another aspect of the present invention, an interconnect structure having sub-lithographic conductively filled lines and vias embedded with a dielectric material is provided. Specifically, the inventive structure comprises:

a dielectric material having at least one conductively filled via having a width from about 10 to about 40 nm, and at least one conductively filled line having a width from about 10 to about 40 nm embedded therein, wherein said at least one conductively filled line is self-aligned to the at least one conductively filled via.

The term "self-aligned" is used in the present application to denote that the via and line openings are formed using one lithographically defined hard mask and the alignment error between the via and line openings is smaller than that between two lithographic masks.

Other aspects, features and advantages of the invention will be more fully apparent from the ensuing disclosure and appended claims.

DETAILED DESCRIPTION OF THE INVENTION

The present invention, which provides an interconnect structure including nano-scale, e.g., sub-lithographic, lines and vias and a method of fabricating the same, will now be described in greater detail by referring to the following description and drawings that accompany the present application. It is noted that the drawings of the present invention are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides a method to form interconnect structures including nano-scale, e.g., sub-lithographic, lines and vias for future generation of semiconductor technology using self-assembly block copolymers that can be placed at a specific location using a pre-fabricated hard mask pattern. This provides an interconnect structure in which the line is self-aligned to the via.

Figure 1A:
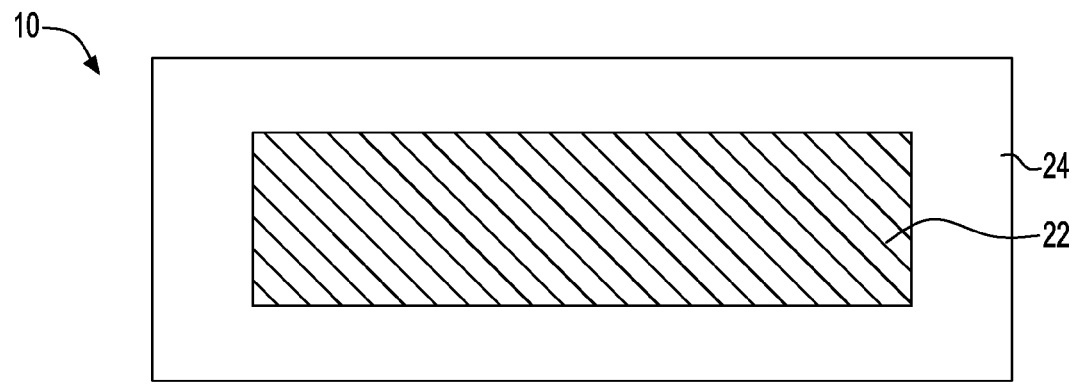
FIGS. 1A-1B are pictorial representations (through a top-down and cross sectional view, respectively) illustrating an initial interconnect structure with a patterned photoresist having at least one lithographically defined opening located atop a hark mask that is disposed above a dielectric material.

The method of the present invention begins by first providing the structure 10 shown in FIGS. 1A (top down view) and 1B (cross sectional view). As is shown in the cross sectional view, the structure 10 includes a first interconnect level 12A which includes a first dielectric material 14A having at least one conductive feature 16 formed therein and a second interconnect level 12B which includes a second dielectric material 14B which are separated by a dielectric cap 15. The structure 10 also includes a material stack 18 comprising an etch stop layer 20 located on an upper surface of the second dielectric material 14B and a hard mask 22 located on an upper surface of the etch stop layer 20. A patterned photoresist 24 having at least one lithographically defined opening 26 is shown atop the hard mask 22.

Figure 1B:
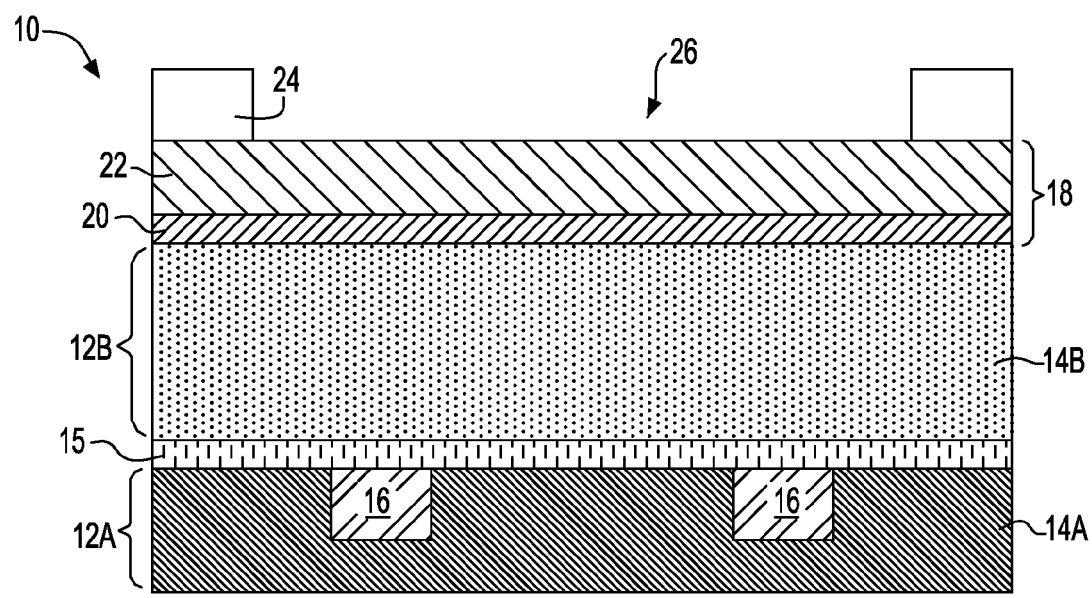

The structure 10 shown in FIGS. 1A and 1B is formed utilizing standard interconnect processing which is well known to those skilled in the art. For example, the structure 10 can be formed by applying the first dielectric material 14A to a surface of a substrate (not shown). The substrate, which is not shown, may comprise a semiconducting material, an insulating material, a conductive material or any combination thereof.

The first dielectric material 14A of the lower interconnect level 12A may comprise any interlevel or intralevel dielectric including inorganic dielectrics or organic dielectrics. The first dielectric material 14A may be porous or non-porous. Some examples of suitable dielectrics that can be used as the first dielectric material 14A include, but are not limited to: $SiO_2$, silsesquioxanes, C doped oxides (i.e., organosilicates) that include atoms of Si, C, O and H, thermosetting polyarylene ethers, or multilayers thereof The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 14A typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the first dielectric material 14A may vary depending upon the dielectric material used as well as the exact number of dielectrics within the lower interconnect level 12A. Typically, and for normal interconnect structures, the first dielectric material 14A has a thickness from about 200 to about 450 nm.

The lower interconnect level 12A also has at least one conductive feature 16 that is embedded in (i.e., located within) the first dielectric material 14A. The conductive feature 16 is separated from the first dielectric material 14A by a barrier layer (not specifically shown). The conductive feature 16 is formed by lithography (i.e., applying a photoresist to the surface of the first dielectric material 14A, exposing the photoresist to a desired pattern of radiation, and developing the exposed resist utilizing a conventional resist developer), etching (dry etching or wet etching) an opening in the first dielectric material 14A and filling the etched region with the barrier layer and then with a conductive material forming the conductive feature 16.

The barrier layer, which may comprise Ta, TaN, Ti, TiN, Ru, RuN, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. The thickness of the barrier layer may vary depending on the exact means of the deposition process as well as the material employed. Typically, the barrier layer has a thickness from about 4 to about 40 nm, with a thickness from about 7 to about 20 nm being more typical.

Following the barrier layer formation, the remaining region of the opening within the first dielectric material 14A is filled with a conductive material forming the conductive feature 16. The conductive material used in forming the conductive feature 16 includes, for example, polySi, a conductive metal, an alloy comprising at least one conductive metal, a conductive metal silicide or combinations thereof. Preferably, the conductive material that is used in forming the conductive feature 16 is a conductive metal such as Cu, W or Al, with Cu or a Cu alloy (such as AlCu) being highly preferred in the present invention. The conductive material is filled into the remaining opening in the first dielectric material 14A utilizing a conventional deposition process including, but not limited to: CVD, PECVD, sputtering, chemical solution deposition or plating. After deposition, a conventional planarization process such as, for example, chemical mechanical polishing (CMP) can be used to provide a structure in which the barrier layer and the conductive feature 16 each have an upper surface that is substantially coplanar with the upper surface of the first dielectric material 14A.

After forming the at least one conductive feature 16, the dielectric cap 15 is formed on an upper surface of the lower interconnect level 12A utilizing a conventional deposition process such as, for example, CVD, PECVD, chemical solution deposition, or evaporation. The dielectric cap 15 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof The thickness of the dielectric cap 15 may vary depending on the technique used to form the same as well as the material make-up of the layer. Typically, the dielectric cap 15 has a thickness from about 15 to about 55 nm, with a thickness from about 25 to about 45 nm being more typical.

Next, the upper interconnect level 12B is formed by applying the second dielectric material 14B to the upper exposed surface of the dielectric cap 15. The second dielectric material 14B may comprise the same or different, preferably the same, dielectric material as that of the first dielectric material 14A of the lower interconnect level 12A. The processing techniques and thickness ranges for the first dielectric material 14A are also applicable here for the second dielectric material 14B.

After forming the second dielectric material 14B, the material stack 18 is then formed on an upper surface of the second dielectric material 14B. In an aspect of the present invention, and as illustrated in FIG. 1B, the material stack 18 comprises an etch stop layer 20, typically an oxide such as silicon dioxide, and a hard mask 22, typically a nitride such as silicon nitride. The material stack 18 is formed utilizing conventional techniques well known to those skilled in the art. For example, a thermal oxidation process can be used in forming the etch stop layer 20, while a thermal nitridation process can be used in forming the hard mask 22. Alternatively, the etch stop layer 20 and the hard mask 22 can each be formed by a conventional deposition process such as, for example, CVD or PECVD. Even further, the etch stop layer 20 and the hard mask 22 may be formed utilizing a combination of thermal and deposition techniques.

After forming the material stack 18, a blanket layer of photoresist material (organic, inorganic or hybrid-type) is then formed atop the upper surface of the material stack 18. The blanket layer of photoresist material is formed by a conventional deposition process such as, for example, CVD, PECVD, evaporation, or spin-on coating. Following the application of the blanket layer of photoresist material, the photoresist material is subjected to lithography to form patterned photoresist 24 having at least one opening 26 which exposes an upper surface of the hard mask 22. The lithographic step includes exposing the photoresist material to radiation and developing the exposed resist utilizing a conventional resist developer. The width of the "lithographically defined" opening 26 is typically from about 60 to about 120 nm.

Figure 2A:
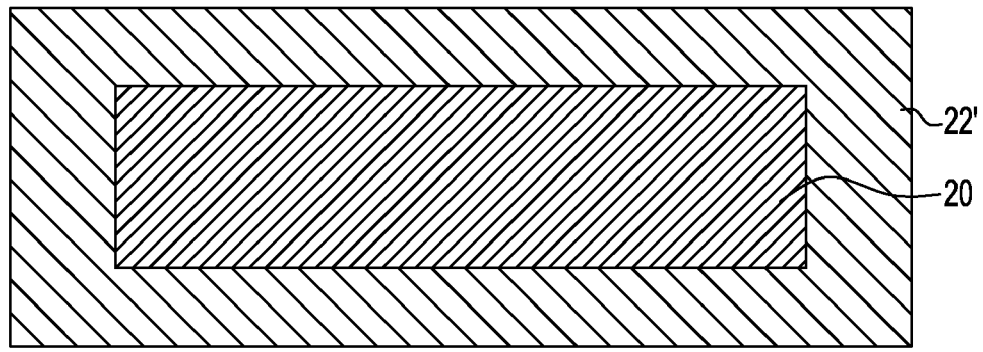
FIGS. 2A-2B are pictorial representations (through a top-down and cross sectional view, respectively) illustrating the structure of FIGS. 1A-1B after transferring the lithographic defined opening into the hard mask.
Figure 2B:
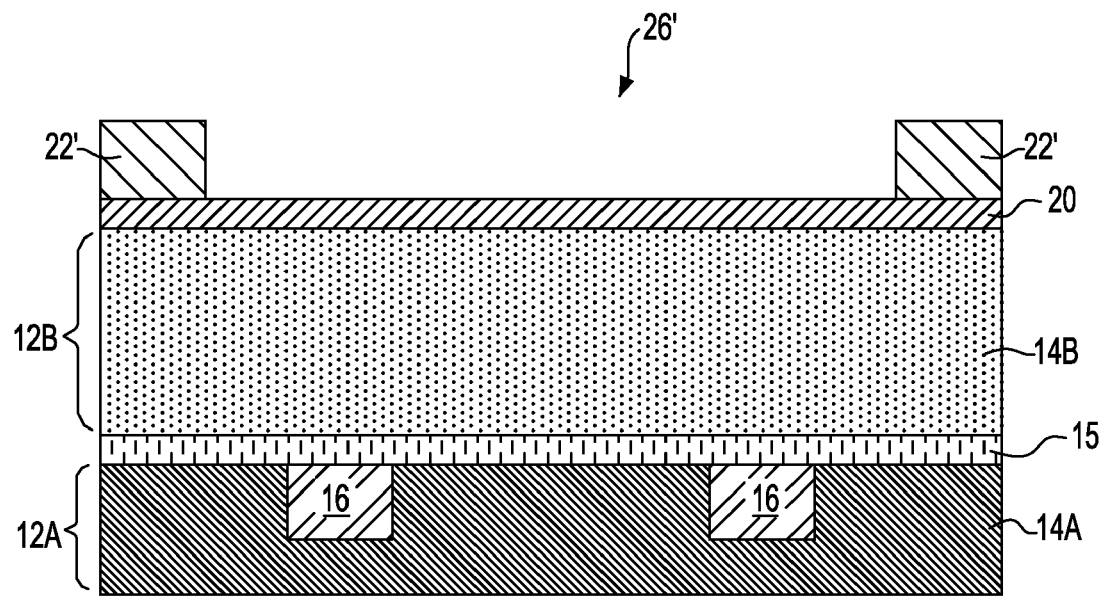

FIGS. 2A (top-down view) and 2B (cross sectional view) illustrate the structure 10 after transferring the pattern from the patterned photoresist 24 to the hard mask 22, stopping on the upper surface of the etch stop layer 20, and stripping of the patterned photoresist 24. In FIG. 2B, reference numeral 26' denotes the lithographically defined mask opening in the now patterned hard mask 22' which exposes the upper surface of the etch stop layer 20. It is noted that the lithographically defined mask opening 26' has a width (W) that is limited by the minimum printing critical dimension (CD) of conventional lithography and cannot be further reduced by lithography. It is further noted that the lithographically defined mask opening 26' has a width from about 60 to about 120 nm.

Next, an etching step that selectively removes the exposed portions of the hard mask 22, not protected by the patterned photoresist 24, is employed to transfer the pattern to the hard mask 22. The etching step typically comprises a reactive-ion etching (RIE) in which $CHF_3$, $CH_2F_2$, $CH_3F$, $O_2$ and other etchants are used as the etchant. After etching and pattern transfer, the patterned photoresist 24 is stripped from the structure utilizing a conventional resist stripping process.

As stated above, the width (W) of the lithographically defined mask opening 26' in hard mask 22 is limited by the minimum printing critical dimension (CD) of conventional lithography and cannot be further reduced using the conventional lithographic techniques alone. The present invention therefore employs self-assembling block copolymers to form sub-lithographic features (line and via openings) in the lithographically defined mask opening 26'.

It has been known that certain materials are capable of spontaneous organization of materials into ordered patterns without the need for human interference, which is typically referred to as the self-assembly of materials. Examples of material self-assembly range from snowflakes to seashells to sand dunes, all of which form some type of regular or ordered patterns in response to the external conditions.

Among various self-assembling materials, self-assembling block copolymers that are capable of self-organizing into nanometer-scale patterns are particularly promising for enabling future advances in the semiconductor technology. Each self-assembling block copolymer system typically contains two or more different polymeric block components that are immiscible with one another. Under suitable conditions, the two or more immiscible polymeric block components separate into two or more different phases on a nanometer scale and thereby form ordered patterns of isolated nano-sized structural units.

Such ordered patterns of isolated nano-sized structural units formed by the self-assembling block copolymers can be used for fabricating nano-scale structural units in semiconductor, optical, and magnetic devices. Specifically, dimensions of the structural units so formed are typically in the range of 10 to 40 nm, which are sub-lithographic (i.e., below the resolutions of the lithographic tools). Further, the self-assembling block copolymers are compatible with conventional semiconductor, optical, and magnetic processes. Therefore, the ordered patterns of nano-sized structural units formed by such block copolymers have been integrated into semiconductor, optical, and magnetic devices where a large, ordered array of repeating structural units are required.

However, the CMOS technology requires precise placement or registration of individual structural units for formation of metal lines and vias in the wiring levels. Therefore, the large, ordered array of repeating structural units formed by self-assembling block copolymers could not be used in CMOS devices, because of lack of alignment or registration of the position of individual structure unit.

The present invention provides a method that combines a conventional lithographic technology with the self-assembling block copolymer technology to form sub-lithographic features in interconnect structure as described above.

Specifically, a thin layer of a first self-assembling block copolymer (having a thickness typically ranging from about 20 nm to about 100 nm) is first applied over the structure shown in FIGS. 2A-2B and then annealed to form an ordered pattern containing repeating structural units inside the already formed lithographically defined mask opening 26'.

Figure 3A:
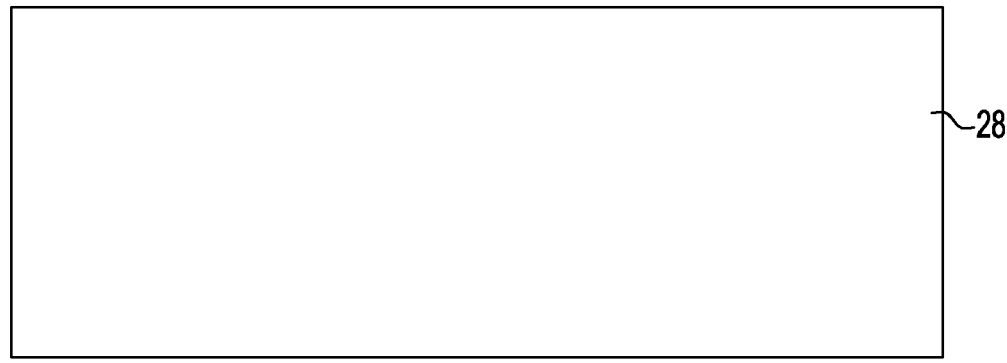
FIGS. 3A-3B are pictorial representations (through a top-down and cross sectional view, respectively) illustrating the structure of FIGS. 2A-2B after applying a first block copolymer on the structure.
Figure 3B:
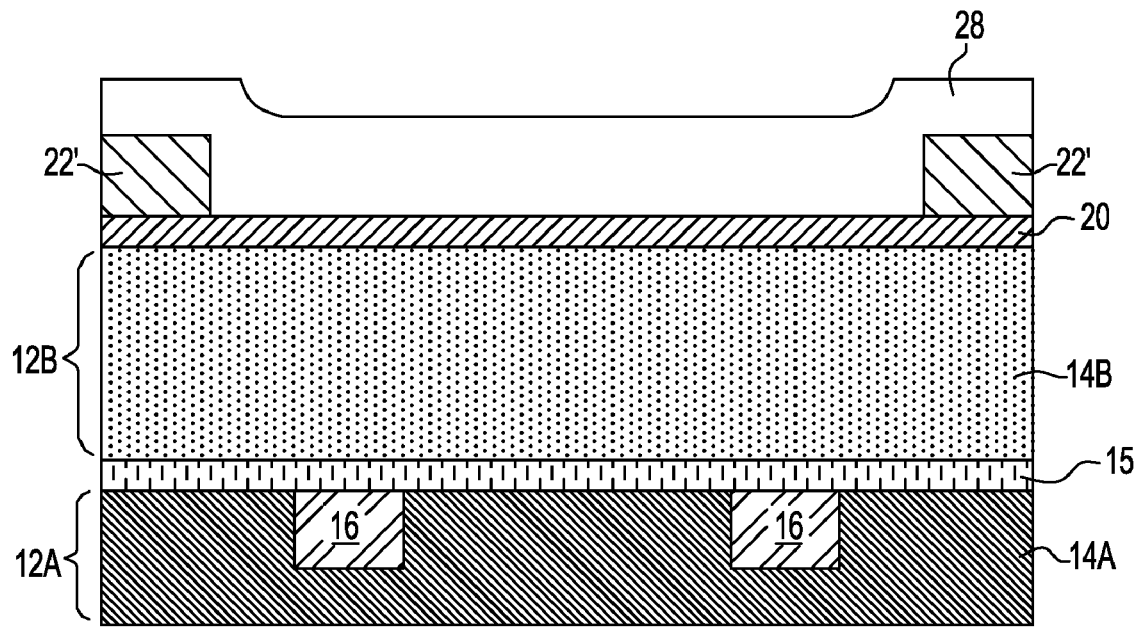
Figure 4A:
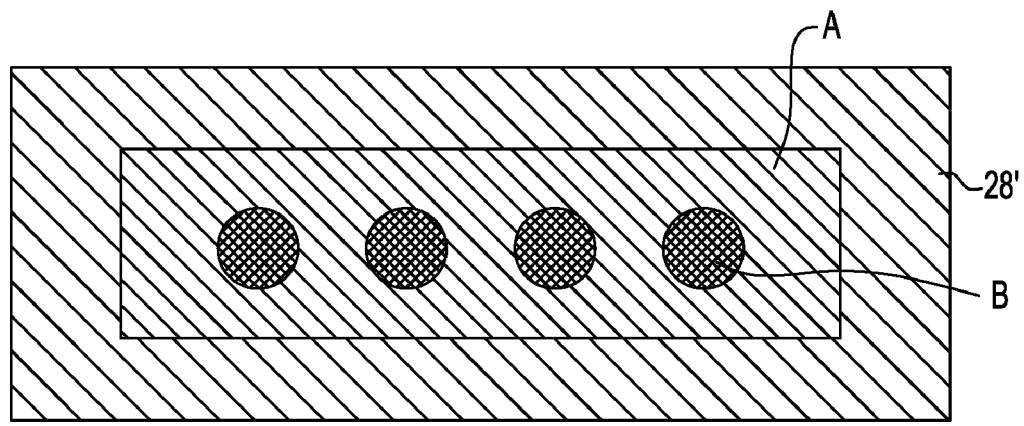
FIGS. 4A-4B are pictorial representations (through a top-down and cross sectional view, respectively) illustrating the structure of FIGS. 3A-3B after annealing the first block copolymer forming an ordered pattern containing repeating structural units within the patterned hard mask.
Figure 4B:
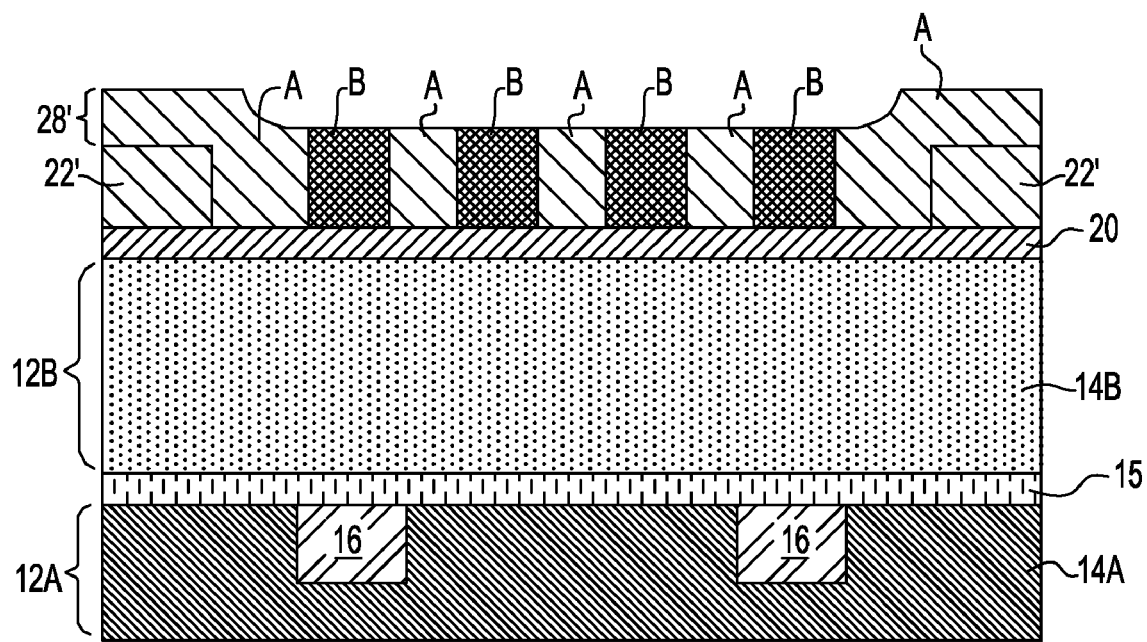

FIGS. 3A-3B show the structure after applying the thin self-assembly block copolymer 28 to the structure shown in FIGS. 2A-2B, while FIGS. 4A-4B show the structure after annealing which forms an annealed block copolymer 28'.

It is noted that the width (W) of the lithographically defined mask opening 26' is carefully adjusted so that only a single unit polymer block can be formed therein from the self-assembling block copolymer. The single unit polymer block is embedded in a polymeric matrix that is in turn located inside the lithographically defined mask opening 26', and it has a width that is less than the diameter of the lithographically defined mask opening 26'. The single unit polymer block can be selectively removed relative to the polymeric matrix, thereby leaving a single opening of the smaller width in the polymeric matrix inside the lithographically defined mask opening 26'. The single opening of the smaller width can then be used for sub-lithographic patterning of the dielectric material 14B.

There are many different types of block copolymers that can be used for practicing the present invention. As long as a block copolymer contains two or more different polymeric block components that are not immiscible with one another, such two or more different polymeric block components are capable of separating into two or more different phases on a nanometer scale and thereby form patterns of isolated nano-sized structural units under suitable conditions.

In a preferred, but not necessary, embodiment of the present invention, the block copolymer consists essentially of first and second polymeric block components A and B that are immiscible with each other. The block copolymer may contain any numbers of the polymeric block components A and B arranged in any manner. The block copolymer can have either a linear or a branched structure. Preferably, such a block polymer is a linear diblock copolymer having the formula of A-B.

Specific examples of suitable block copolymers that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

The specific structural units formed by the block copolymer are determined by the molecular weight ratio between the first and second polymeric block components A and B. For example, when the ratio of the molecular weight of the first polymeric block component A over the molecular weight of the second polymeric block component B is greater than about 80:20, the block copolymer will form an ordered array of spheres composed of the second polymeric block component B in a matrix composed of the first polymeric block component A. When the ratio of the molecular weight of the first polymeric block component A over the molecular weight of the second polymeric block component B is less than about 80:20 but greater than about 60:40, the block copolymer will form an ordered array of cylinders composed of the second polymeric block component B in a matrix composed of the first polymeric block component A. When the ratio of the molecular weight of the first polymeric block component A over the molecular weight of the second polymeric block component B is less than about 60:40 but is greater than about 40:60, the block copolymer will form alternating lamellae composed of the first and second polymeric block components A and B. Therefore, the molecular weight ratio between the first and second polymeric block components A and B can be readily adjusted in the block copolymer of the present invention, in order to form desired structural units.

In a preferred embodiment of the present invention, the ratio of the molecular weight of the first polymeric block component A over the molecular weight of the second polymeric block component B ranges from about 60:40 to about 80:20, so that the block copolymer of the present invention will form alternating layers of the first polymeric block component A and the second polymeric block component B.

Preferably, one of the components A and B can be selectively removable relative to the other, thereby resulting in either orderly arranged structural units composed of the un-removed component. For example, when the second polymeric block component B is selectively removable relative to the first polymeric block component A, orderly arranged trenches can be formed.

In a particularly preferred embodiment of the present invention, the block copolymer used for forming the self-assembled periodic patterns of the present invention is PS-b-PMMA with a PS:PMMA molecular weight ratio ranging from about 20:80 to about 80:20.

Typically, mutual repulsion between different polymeric block components in a block copolymer is characterized by the term $\chi N$, where $\chi$ is the Flory-Huggins interaction parameter and N is the degree of polymerization. The higher $\chi N$, the higher the repulsion between the different blocks in the block copolymer, and the more likely the phase separation therebetween. When $\chi N > 10$ (which is hereinafter referred to as the strong segregation limit), there is a strong tendency for the phase separation to occur between different blocks in the block copolymer.

For a PS-b-PMMA diblock copolymer, $\chi$ can be calculated as approximately $0.028 + 3.9/T$, where T is the absolute temperature. Therefore, $\chi$ is approximately 0.0362 at 473K ($\approx 200°$ C.). When the molecular weight ($M_n$) of the PS-b-PMMA diblock copolymer is approximately 64 Kg/mol, with a molecular weight ratio (PS:PMMA) of approximately 66:34, the degree of polymerization N is about 622.9, so $_{102}$ N is approximately 22.5 at 200° C.

In this manner, by adjusting one or more parameters such as the composition, the total molecular weight, and the annealing temperature, the mutual compulsion between the different polymeric block components in the block copolymer of the present invention can be readily controlled to effectuate desired phase separation between the different block components. The phase separation in turn leads to formation of self-assembled periodic patterns containing ordered arrays of repeating structural units (i.e., spheres, cylinders, or lamellae), as described hereinabove.

In order to form the self-assembled periodic patterns, the block copolymer is first dissolved in a suitable solvent system to form a block copolymer solution, which is then applied onto a surface to form a thin block copolymer layer, followed by annealing of the thin block copolymer layer, thereby effectuating phase separation between different polymeric block components contained in the block copolymer.

The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone. The block copolymer solution preferably contains the block copolymer at a concentration ranging from about 0.1% to about 2% by total weight of the solution. More preferably, the block copolymer solution contains the block copolymer at a concentration ranging from about 0.5 wt % to about 1.5 wt %.

The block copolymer solution can be applied to the surface of an interconnect structure by any suitable techniques, including, but not limited to: spin casting, coating, spraying, ink coating, dip coating, etc. Preferably, the block copolymer solution is spin cast onto the surface of an interconnect structure to form a thin block copolymer layer thereon.

After application of the thin block copolymer layer onto the interconnect surface such as is shown, for example, in FIG. 3A-3B, the entire device structure is annealed to effectuate micro-phase segregation of the different block components contained by the block copolymer, thereby forming the periodic patterns with repeating structural units. Annealing of the block copolymer in the present invention can be achieved by various methods known in the art, including, but not limited to: thermal annealing (either in a vacuum or in an inert atmosphere containing nitrogen or argon), ultra-violet annealing, laser annealing, solvent vapor-assisted annealing (either at or above room temperature), and supercritical fluid-assisted annealing, which are not described in detail here in order to avoid obscuring the invention.

In a particularly preferred embodiment of the present invention, a thermal annealing step is carried out to anneal the block copolymer layer at an elevated annealing temperature that is above the glass transition temperature ($T_g$) of the block copolymer, but below the decomposition or degradation temperature ($T_d$) of the block copolymer. More preferably, the thermal annealing step is carried out an annealing temperature of about 200° C.-300° C. The thermal annealing may last from less than about 1 hour to about 100 hours, and more typically from about 1 hour to about 15 hours. In an alternative embodiment of the present invention, the block copolymer layer is annealed by ultra-violet (UV) treatment.

It is noted that the annealed block copolymer 28' can comprise first and second polymeric components A and B, in which the pattern is an ordered array of cylinders composed of the block component B in a polymeric matrix composed of the polymeric block component A. Such an annealed block copolymer in which the ordered array of cylinders is aligned vertical with a surface of the second dielectric material 14B is shown in FIGS. 4A-4B. It is noted in the embodiment illustrated the B blocks can be used to provide sub-lithographic via openings having a width from about 10 to about 40 nm into the second dielectric material 14B. This is achieved by having the cylindrical shaped block aligned vertical to the surface of the second dielectric material 14B. Although such an embodiment is shown, it is also possible to reverse the order such that a sub-lithographic line opening having a width from about 10 to about 40 nm can be formed. In this embodiment, the cylindrical shaped block is aligned parallel to the surface of the second dielectric material 14B. The particular alignment of the cylindrical block is determined by the surface wetting conditions as are described in greater detail below.

Figure 5A:
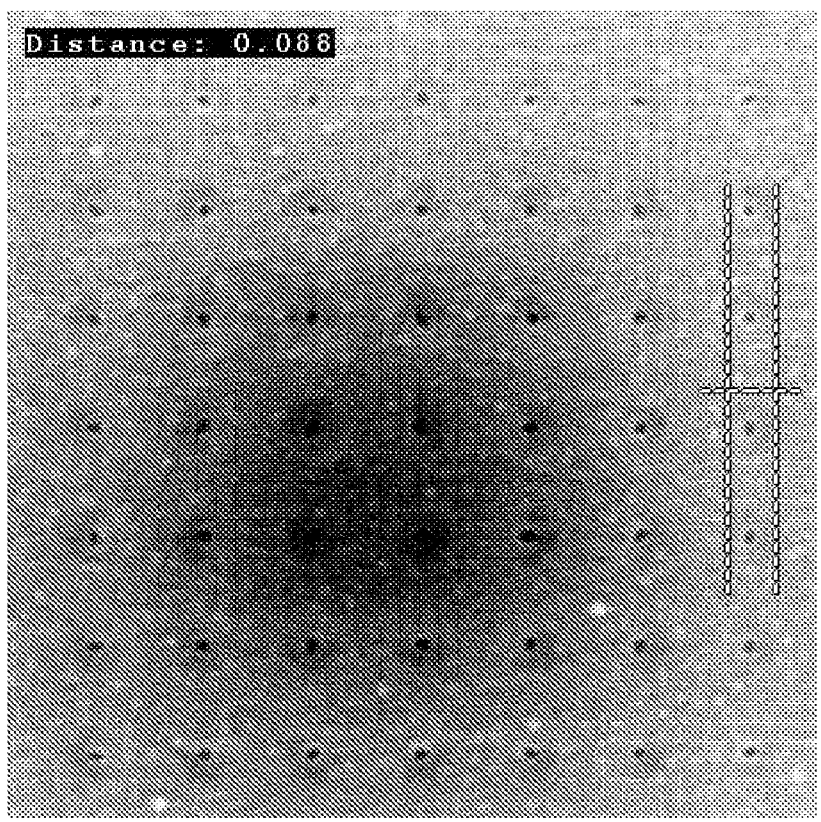
FIGS. 5A-5B are scanning electron micrographic (SEM) images of a pattern formed by annealing a block copolymer in accordance with one aspect of the present invention.
Figure 5B:
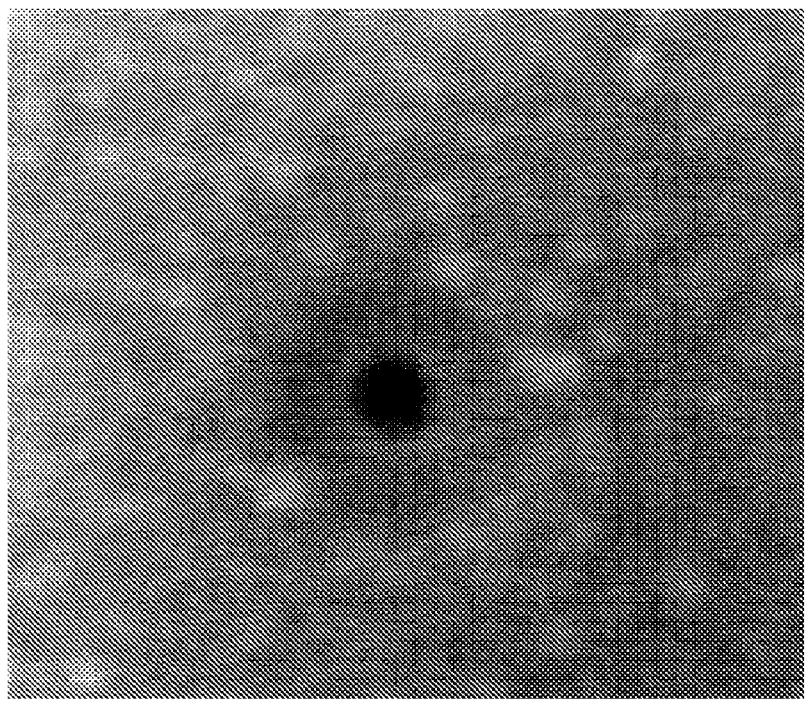

FIG. 5A is a top-down scanning electron microscopic (SEM) photographs of a pattern formed by an annealed block copolymer film that comprises first and second block copolymer components A and B, where the patterned contains an order array of vertically arranged cylinders composed of the polymeric block component B in a polymeric matrix composed of the polymeric block component A. In these SEMs, the dark spots represent the B component. A hard mask layer is deposited and etched with an array of via patterns prior to the application of the block copolymer. Each dark spot (component B of an A-B copolymer) is located at the center of each via shaped hard mask opening. FIG. 5B is a top-down SEM illustrating the details of component B polymer pattern inside the via-shaped hard mask as well as dimensions of the ordered array of cylinders shown in FIG. 5A.

Figure 6A:
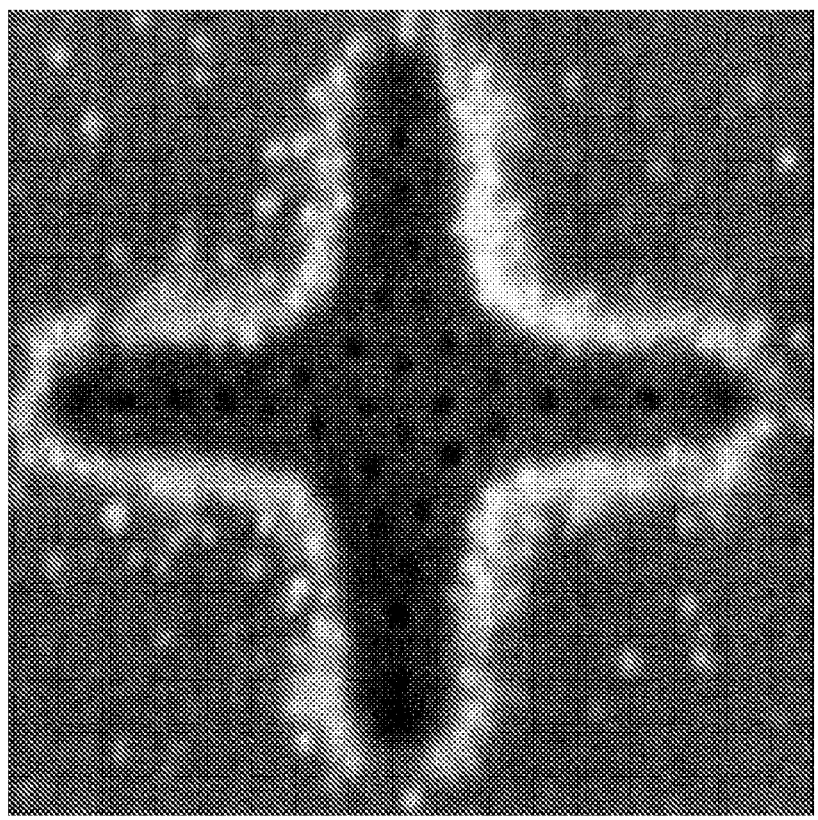
FIGS. 6A-6B are SEM images illustrating an array of component B polymer blocks of an A-B block copolymer inside a pre-patterned hard mask.
Figure 6B:
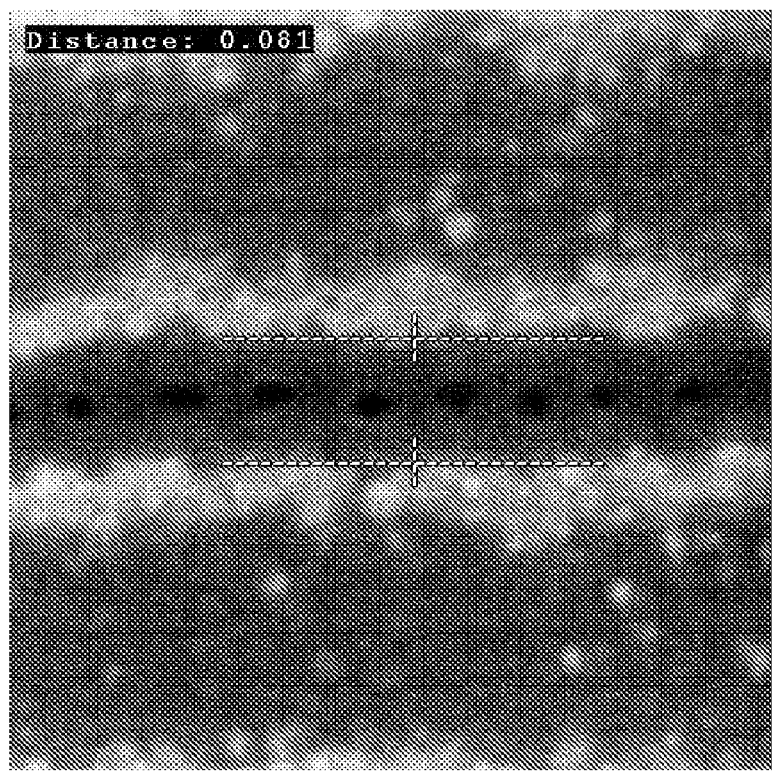

FIGS. 6A-6B are top-down SEMs illustrating an array of component B polymer blocks inside the pre-patterned hard mask.

The present invention employs lithographic features to limit formation and placement of the structural units formed by the self-assembling block copolymer materials. More specifically, the lithographic features as used by the present invention have dimensions that are adjusted so that only a single unit polymer block can be formed and placed inside each lithographic feature from the self-assembling block copolymer.

Optionally, but not necessarily, the interior surfaces of the lithographically defined mask opening 26' are treated before application of a block copolymer layer. Specifically, one or more surface layers are formed over the bottom surface and sidewall surfaces of the lithographically defined mask opening 26', so as to provide the desired wetting properties for aligning the alternating layers of unit polymeric blocks to be formed with the lithographically defined mask opening 26'.

The wetting properties as discussed herein refer to the surface affinities of a specific surface with respect to the different block components of the block copolymers. For example, if a surface has substantially the same surface affinity to both block components A and B of a block copolymer, such a surface is considered a neutral surface or a non-preferential surface, i.e., both block components A and B can wet or have affinities to such a surface. In contrast, if a surface has significantly different surface affinities for the block components A and B, such a surface is then considered a preferential surface, i.e., only one of block components A and B can wet such a surface, but the other cannot.

Surfaces comprising one of silicon native oxides, silicon oxides, and silicon nitrides are preferentially wetted by PMMA block components, but not by PS block components. Therefore, such surfaces can be used as preferential surfaces for PS-b-PMMA block copolymers. On the other hand, a monolayer comprising a substantially homogenous mixture of PS and PMMA components, such as a random PS-r-PMMA copolymer layer, provides a neutral surface or a non-preferential surface for PS-b-PMMA block copolymers.

In order to form alternating layers of polymeric blocks that are aligned perpendicular to the bottom surface of the lithographically defined mask opening 26' from PS-b-PMMA, it is desired to deposit a neutral or non-preferential monolayer (e.g., a substantially homogenous mixture of PS and PMMA components) over the bottom surface of the lithographically defined mask opening 26', while the sidewall surfaces of the lithographically defined mask opening 26' are either left untreated or are coated with a preferential wetting material (e.g., silicon native oxides, silicon oxides, and silicon nitrides). In this manner, the alternating layers of polymeric blocks formed from PS-b-PMMA will stand perpendicular to the bottom surface of the lithographic mask opening 26'.

Figure 7A:
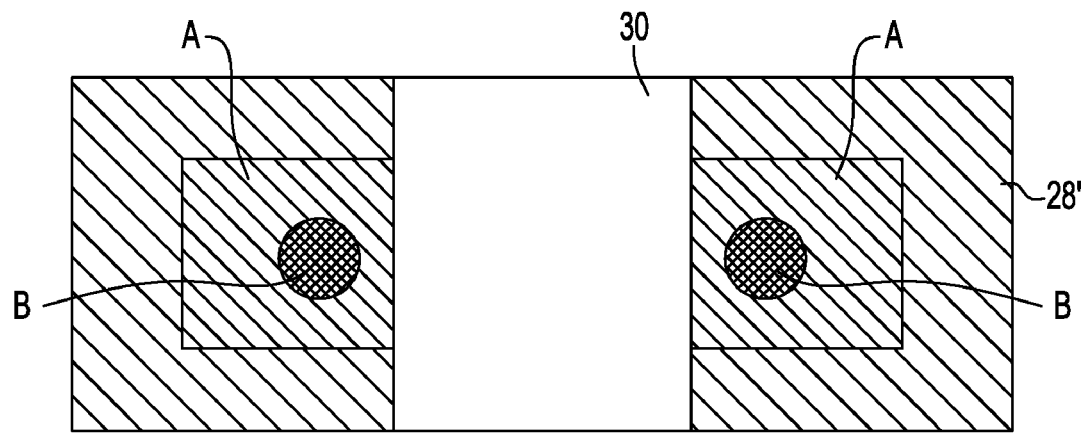
FIGS. 7A-7B are pictorial representations (through a top-down and cross sectional view, respectively) illustrating the structure of FIGS. 4A-4B after applying a patterned mask on some of the component B blocks of an annealed A-B block copolymer.
Figure 7B:
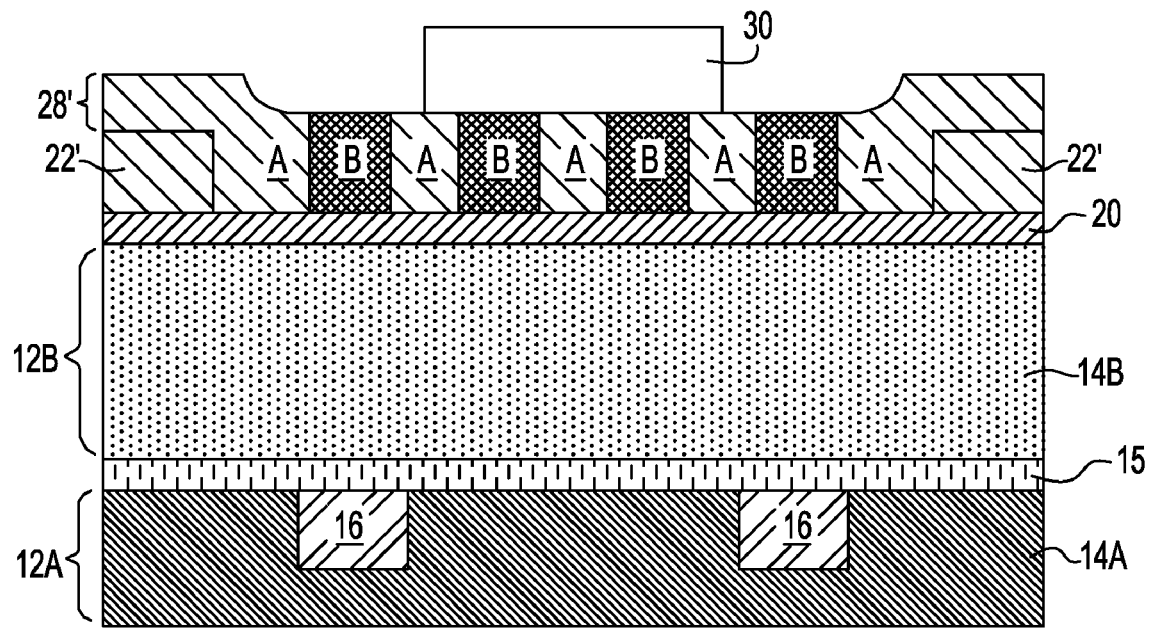

Reference is now made to FIGS. 7A-7B which illustrates the next processing steps of the present invention which are preformed after annealing the block copolymer 28. In particular, FIGS. 7A-7B shows the structure after a patterned photoresist mask 30 is formed atop portions of the annealed block copolymer 28' so as to protect some portions of the annealed block copolymer 28', particularly some of the vertically aligned cylinders B, that are not to be etched. The patterned mask 30 is formed by conventional processes well known in the art, e.g., deposition and lithography.

Figure 8A:
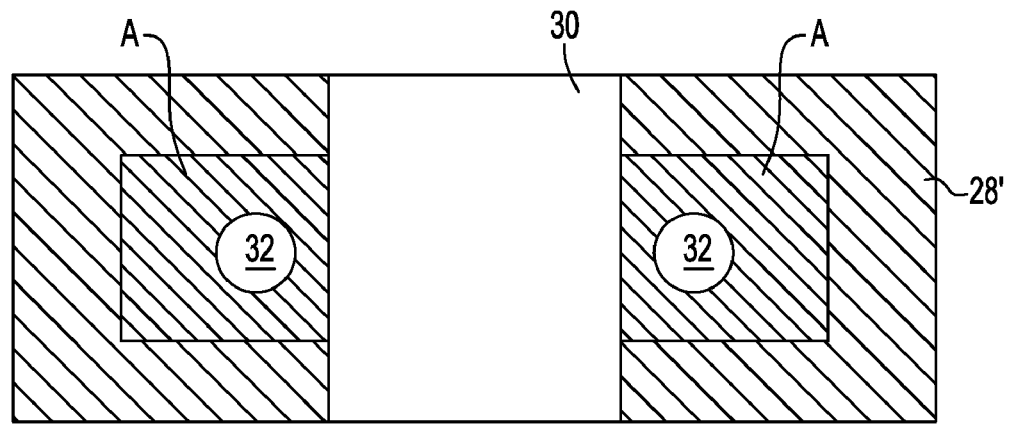
FIGS. 8A-8B are pictorial representations (through a top-down and cross sectional view, respectively) illustrating the structure of FIGS. 7A-7B after selectively removing the exposed component B blocks relative to the component A blocks of an annealed A-B block copolymer forming sub-lithographic via openings in the block copolymer.
Figure 8B:
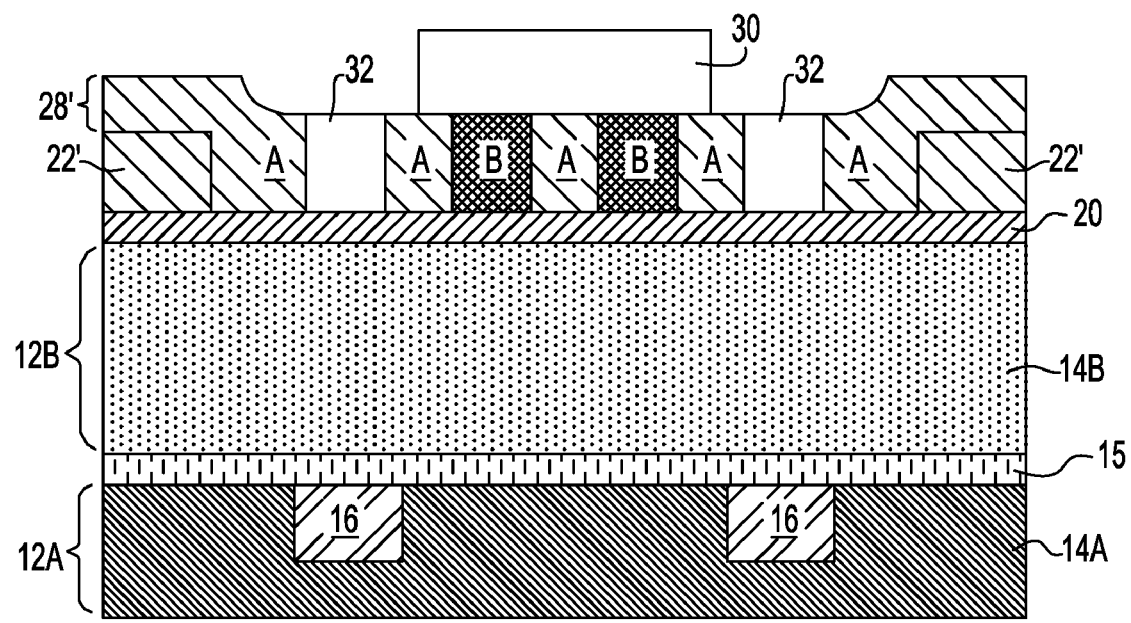

FIGS. 8A-8B show the structure after etching the exposed second polymeric block copolymer component B therefrom. As shown, the resultant structure now includes sub-lithographic via openings 32 having a width from about 10 to about 40 nm in the annealed block copolymer 28'. The sub-lithographic via openings 32 are formed by selectively etching (via a dry etching or wetting etching process) the exposed second polymeric block copolymer component B relative to the first polymeric block copolymer component A utilizing patterned mask 30 as an etch mask.

Figure 9A:
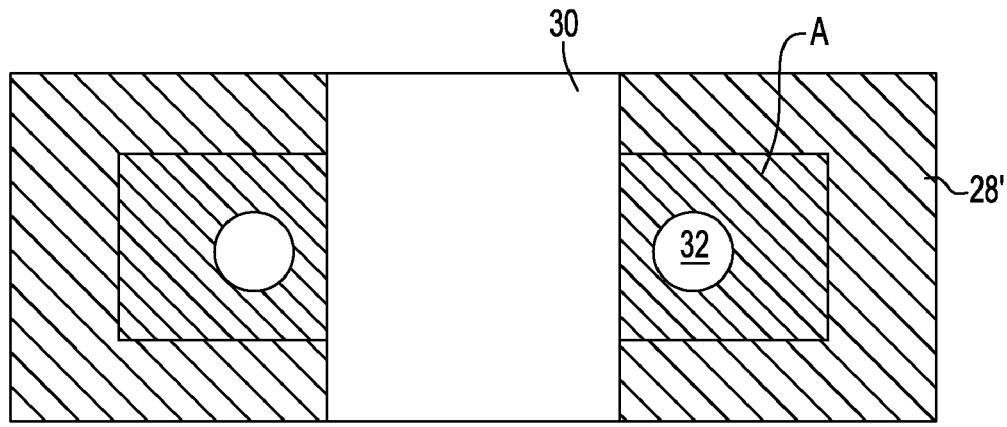
FIGS. 9A-9B are pictorial representations (through a top-down and cross sectional view, respectively) illustrating the structure of FIGS. 8A-8B after transferring the sub-lithographic via openings into the dielectric material.
Figure 9B:
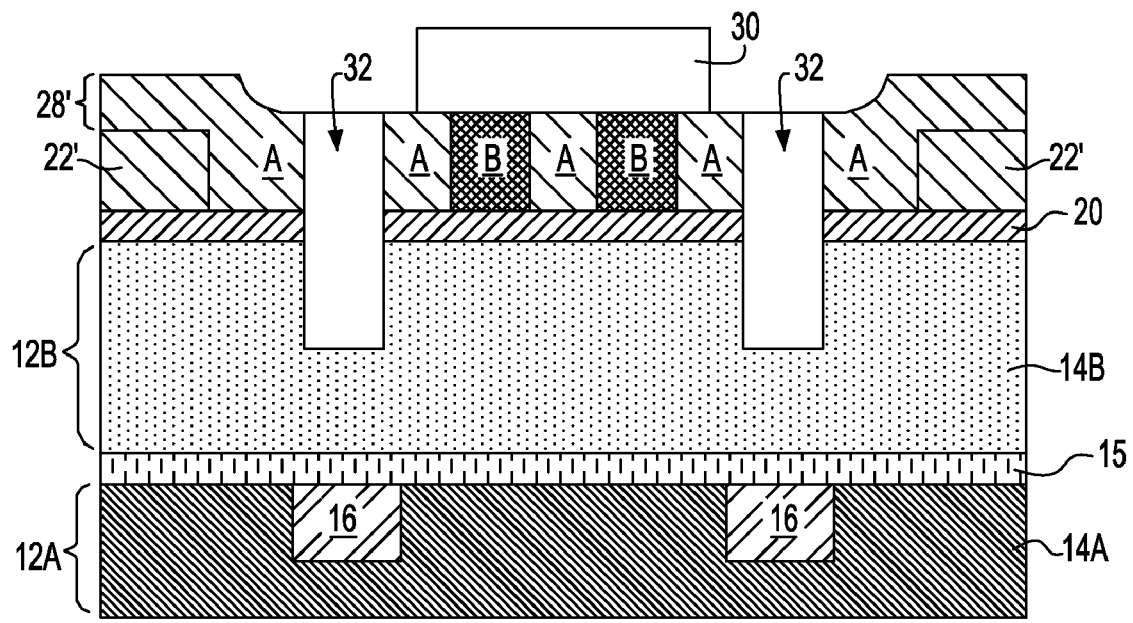

FIGS. 9A-9B show the structure after extending the sub-lithographic via openings 32 through portions of the underlying etch stop layer 20 and second dielectric material 14B. The extending of the sub-lithographic via openings 32 is performed utilizing an etching process such as, for example, reactive-ion etching.

Figure 10A:
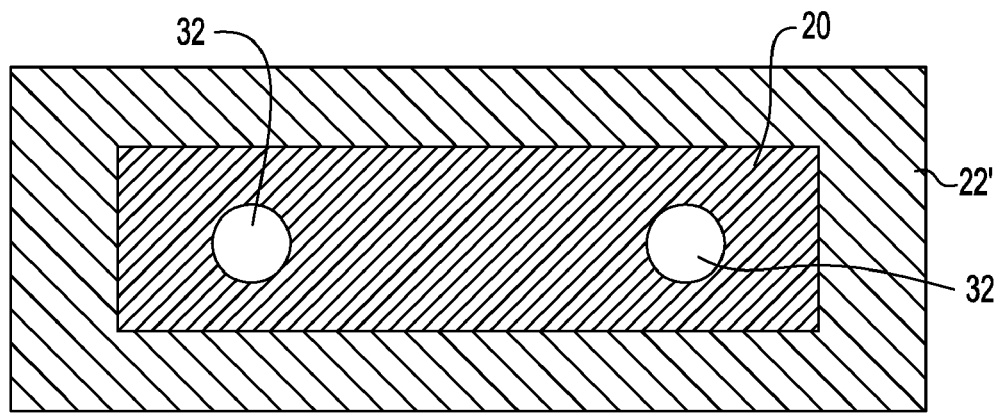
FIGS. 10A-10B are pictorial representations (through a top-down and cross sectional view, respectively) illustrating the structure of FIGS. 9A-9B after removing the remaining block copolymer from said structure.
Figure 10B:
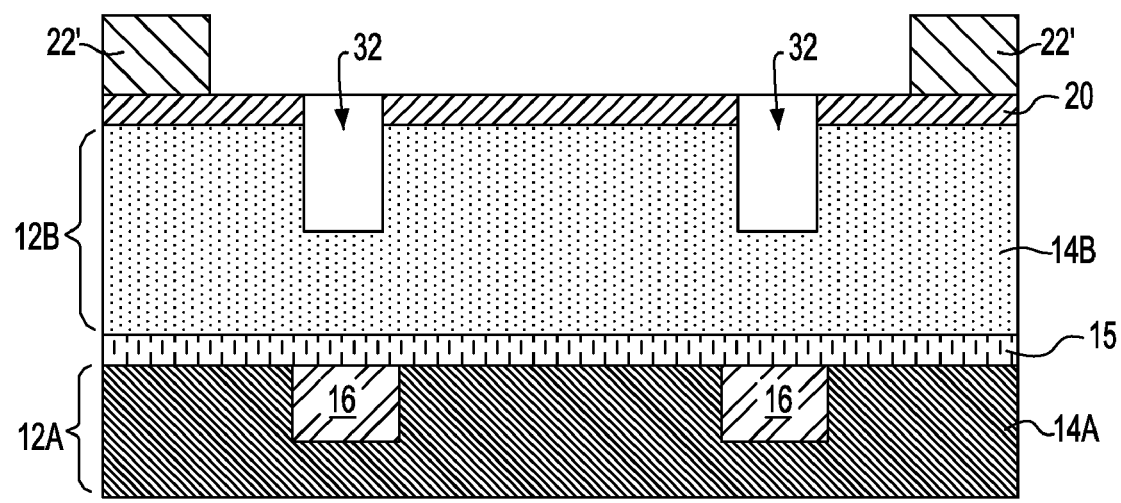

FIGS. 10A-10B illustrate the structure after the patterned mask 30 and the remaining portions of the annealed block copolymer 28' have been removed. A single polymer stripping step, or multiple polymer stripping steps, can be employed in the present invention.

Figure 11A:
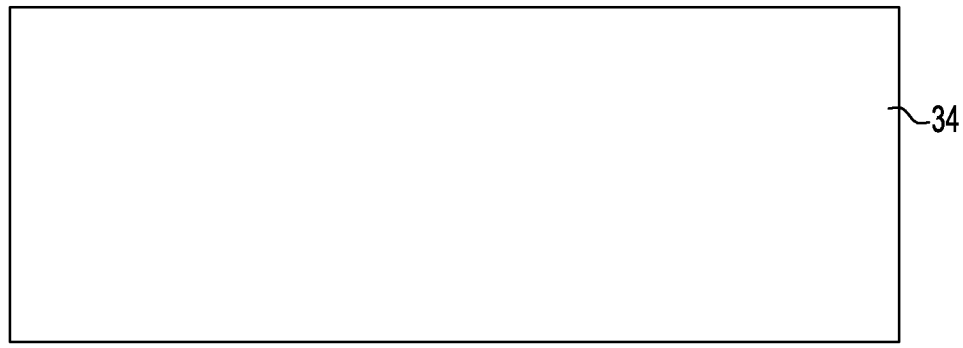
FIGS. 11A-11B are pictorial representations (through a top-down and cross sectional view, respectively) illustrating the structure of FIGS. 10A-10B after applying a second block copolymer to said structure.
Figure 11B:
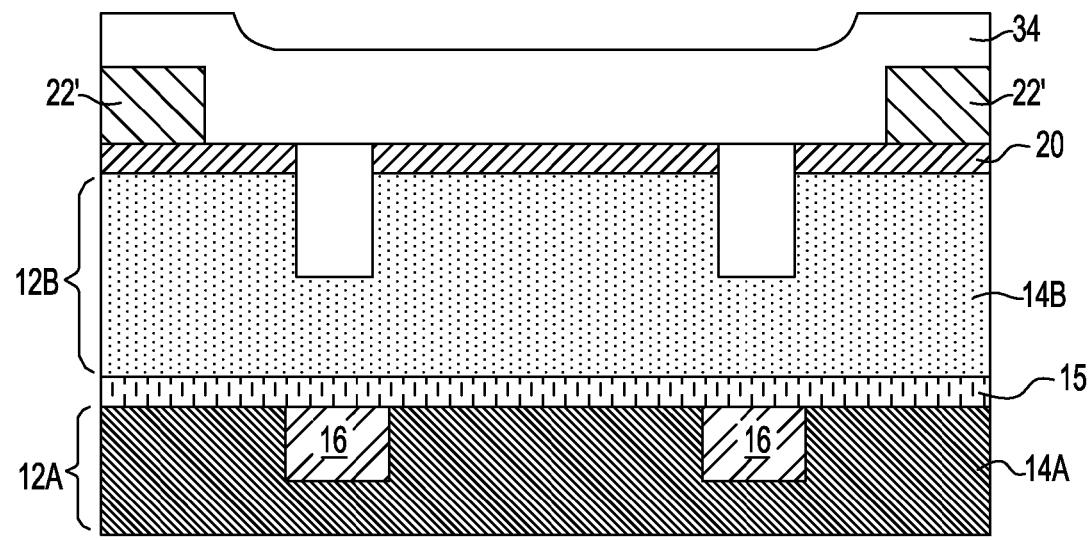

Following the formation of the structure shown in FIGS. 10A-10B, a second thin self-assembly block copolymer layer 34 is applied to the structure as is shown in FIGS. 11A-11B. The second block copolymer 34 may comprise the same or different block copolymer, the only difference being that the surface wetting conditions are chosen such that the ordered array of cylindrical blocks of the annealed block copolymer is aligned in a different direction than that of the first. For the case illustrated above, the second block copolymer has wetting conditions such that the ordered array of cylindrical blocks of the annealed polymer is aligned parallel with the surface of the interconnect structure thus allowing for forming a sub-lithographic line opening patterns having a width from about 10 to about 40 nm.

Figure 12A:
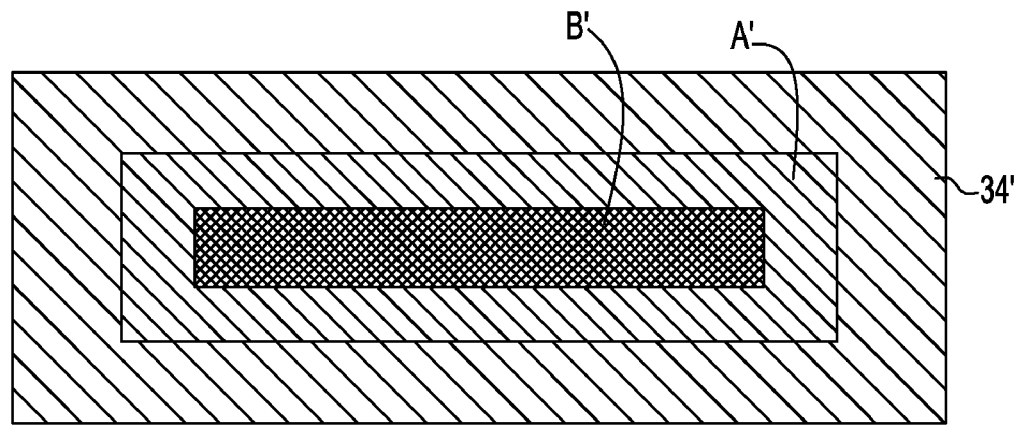
FIGS. 12A-12B are pictorial representations (through a top-down and cross sectional view, respectively) illustrating the structure of FIGS. 11A-11B after annealing the second block copolymer forming a second ordered pattern containing repeating structural units within the patterned hard mask.
Figure 12B:
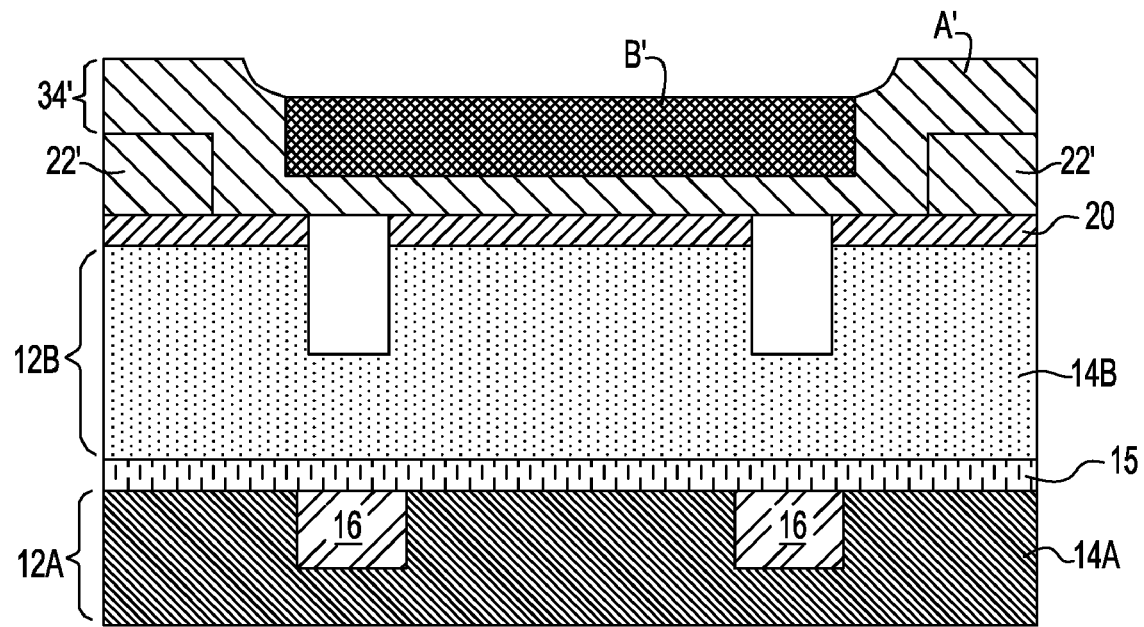

FIGS. 12A-12B illustrate the structure after the second block copolymer has been annealed (using the conditions described above) to form an annealed block copolymer 34' comprising first and second polymeric components A' and B', in which the pattern is an ordered array of cylinders composed of the block component B' in a polymeric matrix composed of the polymeric block component A'. In the embodiment illustrated, the B block copolymer is aligned parallel with the surface of the interconnect structure.

Figure 13A:
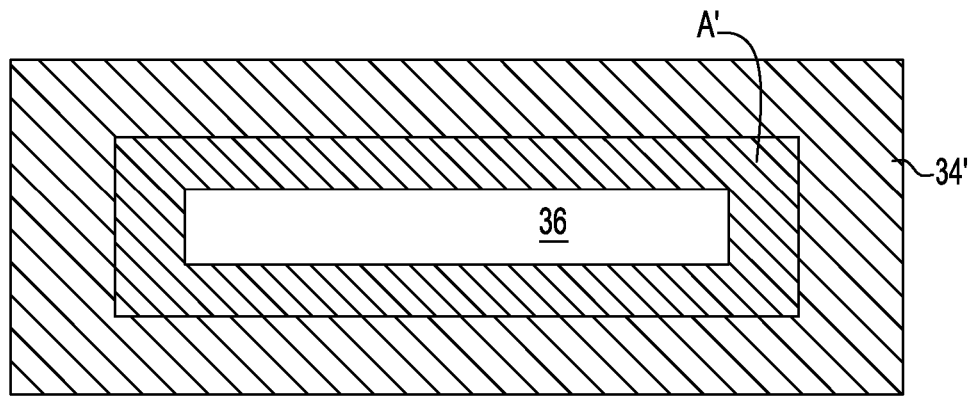
FIGS. 13A-13B are pictorial representations (through a top-down and cross sectional view, respectively) illustrating the structure of FIGS. 12A-12B after selectively removing the component B blocks relative to the component A blocks of the second annealed A-B block copolymer forming sub-lithographic line openings in the second block copolymer.
Figure 13B:
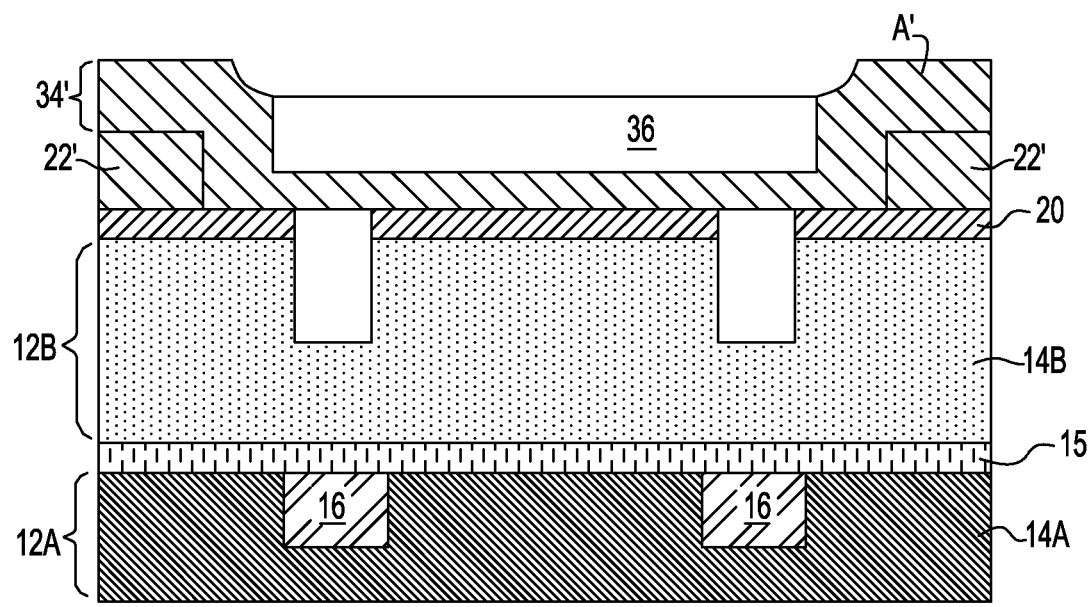

FIGS. 13A-13B illustrate the structure after removing the ordered array of cylinders composed of the block component B' that are aligned parallel to the surface of the substrate selective to block component A'. This removal process is performed utilizing a selective etching process including dry etching or wet etching. It is noted that in FIGS. 13A-13B, reference numeral 36 represents a sub-lithographic line opening having a width from about 10 to about 40 nm.

Figure 14A:
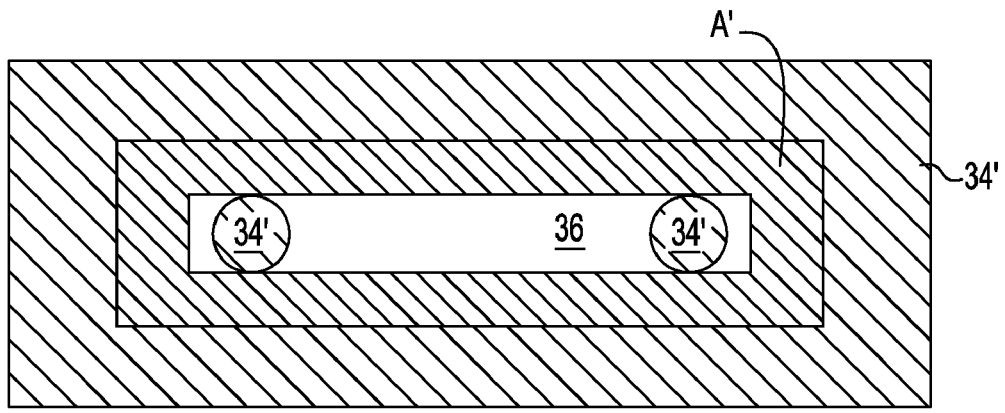
FIGS. 14A-14B are pictorial representations (through a top-down and cross sectional view, respectively) illustrating the structure of FIGS. 13A-13B after transferring the sub-lithographic line openings into the dielectric material.
Figure 14B:
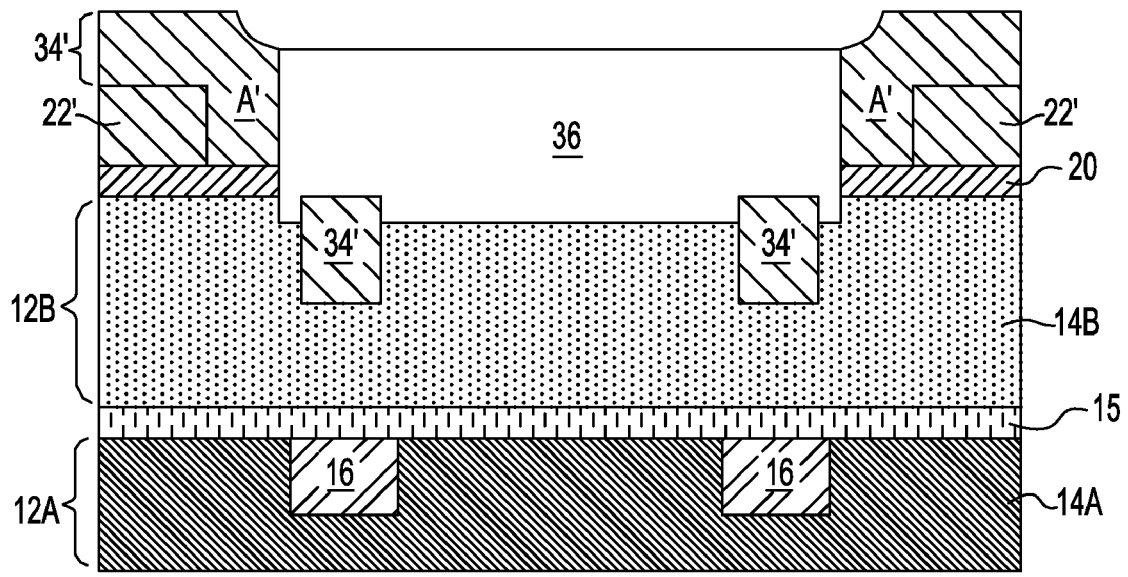

FIGS. 14A-14B illustrate the structure after extending the sub-lithographic line opening 36 into the underlying portions of the etch stop layer 20 and the second dielectric material 14B. A reactive-ion etching process is typically used to extend the sub-lithographic line opening into the structure.

Figure 15A:
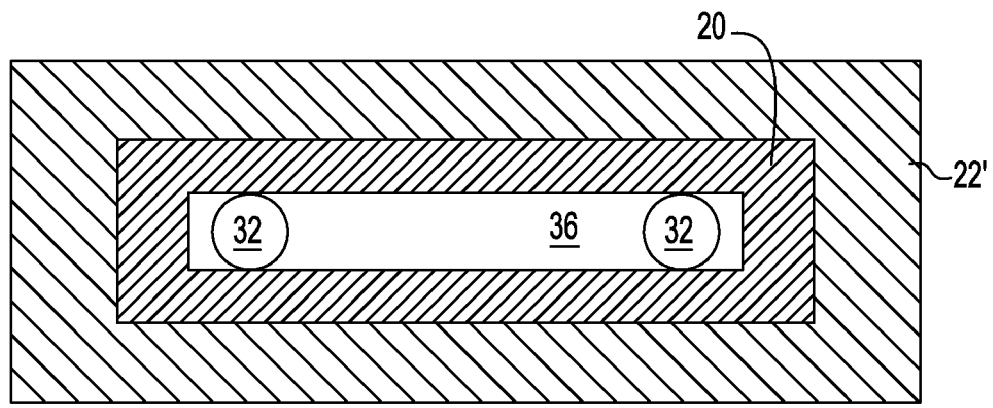
FIGS. 15A-15B are pictorial representations (through a top-down and cross sectional view, respectively) illustrating the structure of FIGS. 14A-14B after removing the remaining second block copolymer from said structure.
Figure 15B:
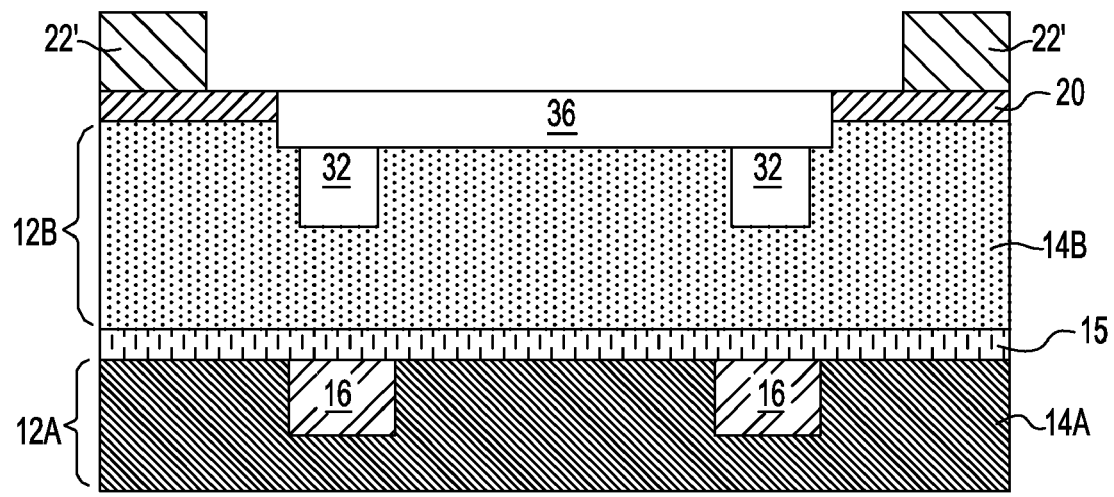

FIGS. 15A-15B illustrate the structure after removing the block component A' utilizing a conventional stripping process that selectively removes a polymeric material relative to a dielectric material.

Figure 16A:
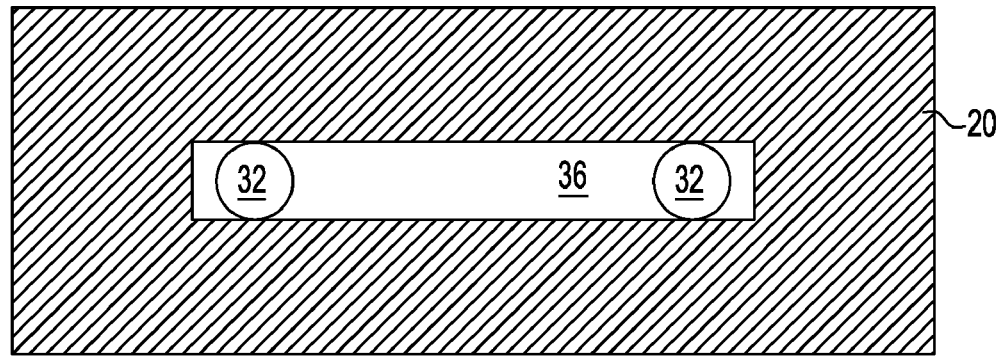
FIGS. 16A-16B are pictorial representations (through a top-down and cross sectional view, respectively) illustrating the structure of FIGS. 15A-15B after removing the patterned hard mask from said structure.
Figure 16B:
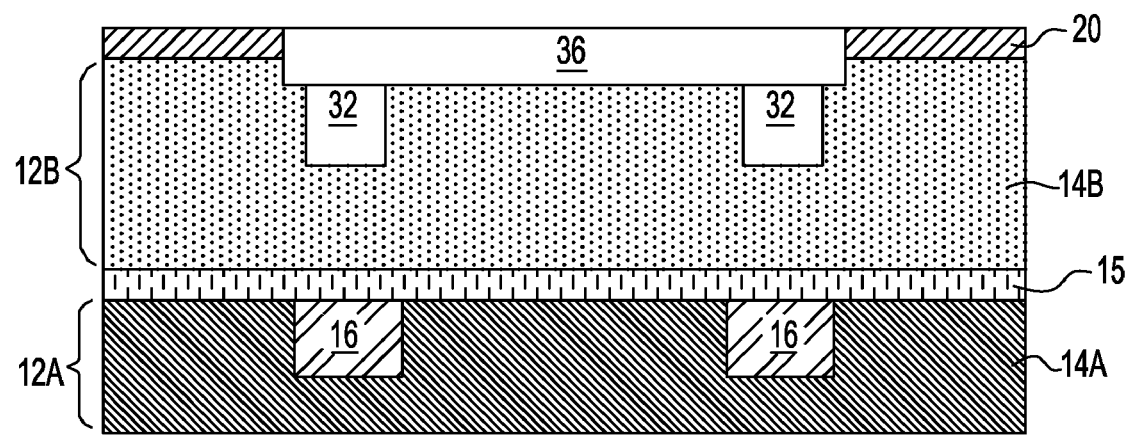

FIGS. 16A-16B illustrate the structure after a planarizing step (such as chemical mechanical polishing) has been performed which removes the remaining patterned hard mask 22' from the structure exposing the upper surface of the etch stop layer 20.

Figure 17A:
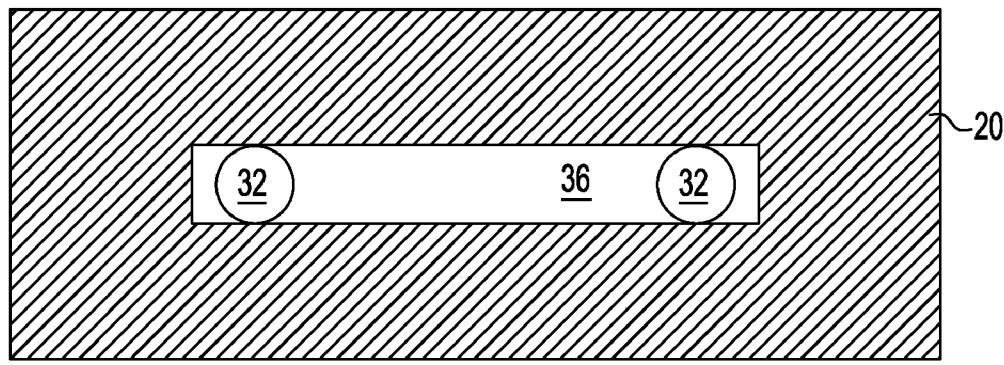
FIGS. 17A-17B are pictorial representations (through a top-down and cross sectional view, respectively) illustrating the structure of FIGS. 16A-16B after extending both the sub-lithographic via and line openings into said dielectric material.
Figure 17B:
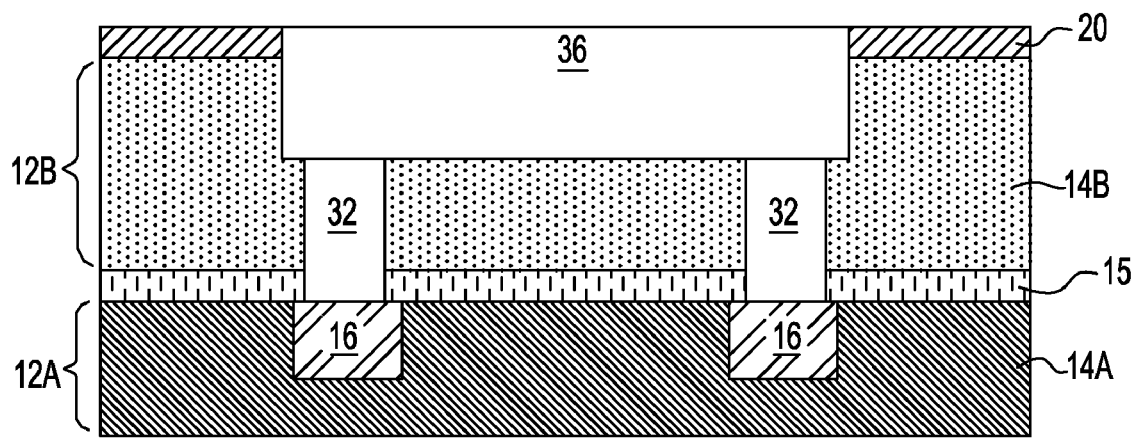

FIGS. 17A-17B illustrate the structure after an etching process such as reactive-ion etching (RIE) is performed which extends both the sub-lithographic line opening 36 and the sub-lithographic via opening 32 into the second dielectric material 14B. Since the sub-lithographic via opening 32 has a smaller width than the sub-lithographic line opening 36, it etches at a faster rate than the line opening 36.

Figure 18A:
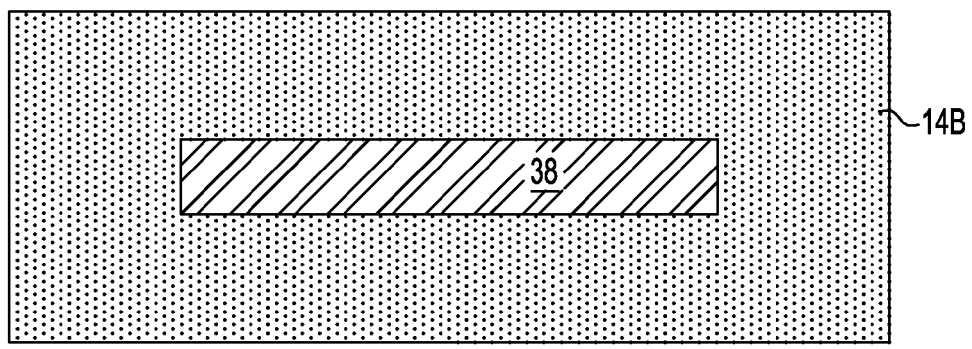
FIGS. 18A-18B are pictorial representations (through a top-down and cross sectional view, respectively) illustrating the structure of FIGS. 17A-17B after filling said extended sub-lithographic line and via openings with a conductive material.
Figure 18B:
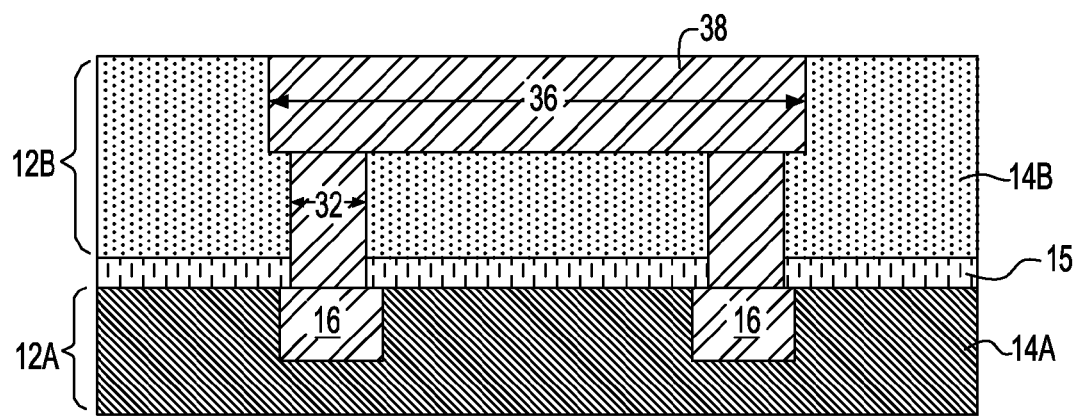

FIGS. 18A-18B illustrate the structure after conductive material 38 has been formed into the sub-lithographic via and line openings. The conductive material 38 used in filling the sub-lithographically defined openings includes, for example, polySi, a conductive metal, an alloy comprising at least one conductive metal, a conductive metal silicide or combinations thereof. Preferably, the conductive material 38 is a conductive metal such as Cu, W or Al, with Cu or a Cu alloy (such as AlCu) being highly preferred in the present invention. The conductive material 38 is filled into the sub-lithographically defined via and line openings utilizing a conventional deposition process including, but not limited to: CVD, PECVD, sputtering, chemical solution deposition or plating. After deposition, a conventional planarization process such as, for example, chemical mechanical polishing (CMP) can be used to provide a planarized structure as is shown in FIGS. 18-18B. It is emphasized that the sub-lithographic conductively filled line is self-aligned to that of the underlining sub-lithographically filled via.

It is emphasized that the above describes an aspect of the present invention in which both sub-lithographic lines and vias are formed into a dielectric material. Although such an embodiment is described and illustrated, the present invention also works when only one type of sub-lithographic feature (line or via) is formed into the dielectric material. The above procedure may also be repeated in some embodiments to form a multilayered interconnect structure in which each level of interconnect includes at least one sub-lithographic feature located within a dielectric material.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming an interconnect structure comprising:
providing a structure including a patterned hard mask having a lithographically defined opening having a width from about 60 to about 120 nm located above a dielectric material;
forming at least one self-assembling block copolymer embedded within said lithographically defined opening, said forming the at least one self-assembling block copolymer including applying a layer of a block copolymer comprising polystyrene-block-polymethylmethacrylate (PS-b-PMMA) having a PS: PMMA weight ratio ranging from about 20:80 to about 80:20 over the patterned hard mask, wherein the block copolymer comprises at least a first polymeric component and second polymeric block component that are immiscible with each other and annealing the block copolymer to form a single unit polymer block inside said lithographically defined opening of said patterned hard mask, wherein said single unit polymer block comprises the second polymeric block component comprising an ordered array of cyclinders that is aligned vertical to a surface of said dielectric material and is embedded in a polymeric matrix that comprises the first polymeric block component, said cylinders having sub-lithographic widths from about 10 to about 40 nm;

selectively removing one of said first or second polymeric components relative to the other component to form sub-lithographic openings in said at least one self-assembling block copolymer;

transferring said sub-lithographic openings into said dielectric material; and filling said sub-lithographic openings with a conductive material.

* * * * *